United States Patent
Weissenberger (12)

(10) Patent No.: US 6,335,620 B1
(45) Date of Patent: Jan. 1, 2002

(54) METHOD OF ACQUIRING EDDY CURRENTS THAT ARE CAUSED BY SWITCHED MAGNETIC FIELD GRADIENTS OF A MAGNETIC RESONANCE APPARATUS AND THAT CONTAIN CROSS-TERMS

(75) Inventor: Volker Weissenberger, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/467,948

(22) Filed: Dec. 21, 1999

(30) Foreign Application Priority Data

Dec. 22, 1998 (DE) ................................ 198 59 501

(51) Int. Cl.⁷ ............................. G01V 3/00; G01R 33/20
(52) U.S. Cl. ............................. 324/307; 324/309
(58) Field of Search ..................... 324/307, 309, 324/310, 311, 312, 313, 314

(56) References Cited

U.S. PATENT DOCUMENTS

| 4,910,460 | A | | 3/1990 | Sebok |
| 5,451,877 | A | | 9/1995 | Weissennberger |
| 5,614,827 | A | | 3/1997 | Heid |
| 5,677,628 | A | * | 10/1997 | Watanabe et al. ............ 324/309 |
| 6,181,134 | B1 | * | 1/2001 | Wald ............................. 324/307 |

FOREIGN PATENT DOCUMENTS

| DE | PS 43 25 031 | 11/1994 |
| EP | 0 228 056 | 7/1987 |

OTHER PUBLICATIONS

Temporal and Spatial Analysis of Fields Generated by Eddy Currents in Superconducting Magnets: Optimization of Corrections and Quantative Characterization of Magnet/Gradient Systems, Boesch et al., Magnetic Resonance in Medicine, vol. 20, 1991, pp. 268–284.

* cited by examiner

*Primary Examiner*—Hezron Williams
*Assistant Examiner*—Tiffany A. Fetzner
(74) *Attorney, Agent, or Firm*—Schiff Hardin & Waite

(57) ABSTRACT

In a method for acquiring eddy currents that are caused by switched magnetic field gradients and that contain cross-terms, at least the cross-terms can be determined from the selected slice within a short time, by the steps of introducing a spatially expansive phantom into the examination region of the magnetic resonance apparatus, activating a measuring gradient pulse that exhibits a prescribable pulse width, and after the deactivation of the measuring gradient pulse generating at least two imaging sequence blocks following one another at the spacings ($t_1$, $t_2$, $t_n$) with at least two-dimensional, complex data set being generated from their imaging signals, the phase information contained therein being proportional to the magnetic field strength.

15 Claims, 1 Drawing Sheet

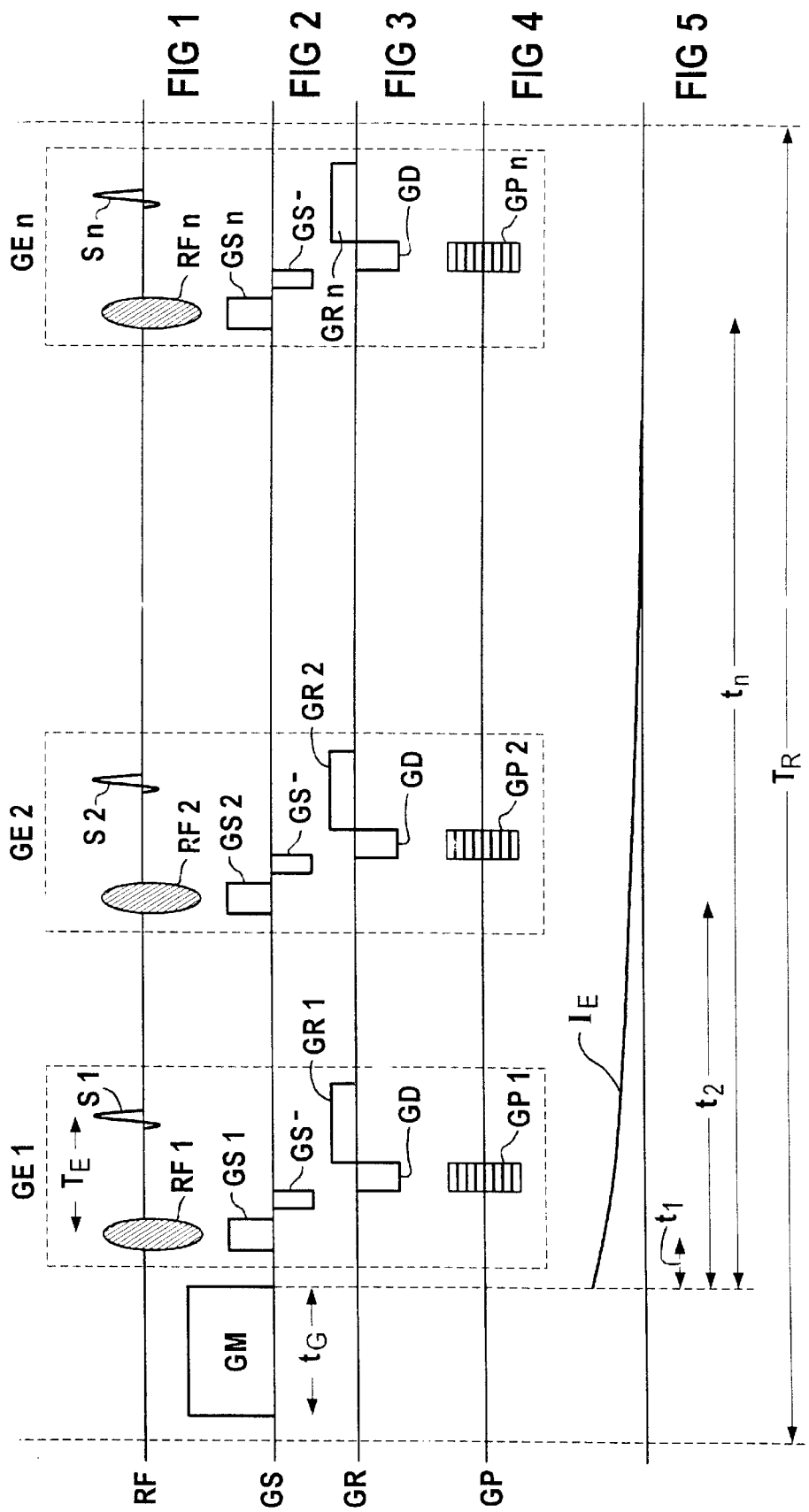

METHOD OF ACQUIRING EDDY CURRENTS THAT ARE CAUSED BY SWITCHED MAGNETIC FIELD GRADIENTS OF A MAGNETIC RESONANCE APPARATUS AND THAT CONTAIN CROSS-TERMS

BACKGROUND OF THE INVENTION

1. Field of the Invention

The present invention is directed to a method for acquiring (identifying) eddy currents that are caused by switched magnetic field gradients in a magnetic resonance apparatus and that contain cross-terms.

2. Description of the Prior Art

A method for the compensation of eddy currents caused by gradients in a magnetic resonance apparatus is disclosed in German OS 43 13 392. The gradients serve the purpose of generating a magnetic field gradient. This magnetic field gradient is needed in order to generate a spatial resolution of the nuclear magnetic resonance signals in magnetic resonance tomography. To this end, a uniform, static basic field on the order of magnitude of 1 Tesla has such a magnetic field gradient superimposed on it. For a spatial resolution in three dimensions, magnetic field gradients must be generated respectively in three directions that preferably reside perpendicularly on one another. A substantially constant magnetic gradient Gy in the y-direction is generated by gradient coils within a spherical examination volume. The gradient coils for the magnetic field gradient in the x-direction are constructed identically to the gradient coils for the magnetic field gradient in the y-direction and are merely rotated by 90° in azimuthal direction. The gradient coils for the magnetic field gradient in the z-direction are annular and are arranged symmetrically relative to the mid-point of the examination volume. Two individual coils respectively have current flowing therein in opposite directions and thereby generate a magnetic field gradient in the z-direction.

The required magnetic field gradients must exhibit steep leading and trailing edges and must be as constant as possible during the on duration. Due to the steep leading and trailing edges, however, eddy currents are induced in metallic parts of the nuclear magnetic resonance apparatus, particularly in the inside tube of the cryostat surrounding the examination space, these eddy currents in turn generate magnetic fields that are directed opposite the magnetic field gradient. This leads to a rounding of the corners of the desired square-wave pulses and to a parasitic magnetic field that decays after the de-activation of the magnetic field gradients.

The curve of the magnetic fields B(t) caused by the eddy currents can be represented as follows:

$$B(t)=B0(t)+Gx(t)x+Gy(t)y+Gz(t)z+0(t, x^2, y^2, z^2),$$

wherein $B0(t)$ is the location-independent term of the 0th order, $Gx$, $Gy$, $Gz$ are the terms of the first order and $0(t, x^2, y^2, z^2)$ is the term of the second order.

The terms $Gx$, $Gy$, $Gz$ of the first order thereby dominate. Only these can be compensated in the known eddy current compensation techniques and must be exactly measured. The terms of a higher order, particularly of the third order, can not be compensated with the known methods and are only of significance for greater distances from the center. The location-independent term of the first order $B0(t)$ is generally small and can arise, for example, from the asymmetrical arrangement of the gradient coil in the magnet or from other effects that disturb the symmetry. It is adequate for definition of the terms of the 0th and of the first order to measure the magnetic field arising from the eddy currents for each direction x, y, z at two points spatially separated in the respective direction.

In the method according to German OS 43 13 392, a spatially expansive phantom, as is employed in magnetic resonance tomography systems for other testing and setting purposes, is introduced into the examination space and is measured with a slice-selective MR method. An eddy current compensation without specific devices such as measuring probes and holders can be implemented and checked with the method according to German OS 43 13 392. The manipulation of the method is simple since the phantom need not be moved for the measurement. Further, it can be determined in a simple way as to whether additional inserts such as, for example, a surface coil lead to additional eddy currents. The method according to German OS 43 13 392, however, is not able to determine the terms of higher orders.

Further, European Application 0 228 056 discloses a method wherein the magnetic field curve is measured by the magnetic resonance signals induced in a specimen. Since the measurement of the magnetic field is required at at least two locations of the examination space, the specimen must be changed back and forth between two measuring positions for each measuring cycle. The specimen would have to be placed at many measuring positions for identifying eddy currents of a higher order, which would be extremely complicated.

German PS 43 25 031 and U.S. Pat. No. 4,910,460 teach measuring the eddy currents with an expansive phantom with slice-selective MR imaging. The methods disclosed therein only supply a spatial information but no time information about the eddy current distribution. These methods thus only allow the graphic presentation of the spatial eddy current distribution and are not suited for quantitative determination of the amplitudes and time constants of the eddy currents that however, would be necessary for compensation of the eddy currents.

Further, the article "Temporal and Spatial Analysis of Fields Generated by Eddy Currents in Superconducting Magnets: Optimization of Corrections and Quantitative Characterization of Magnet/Gradient Systems" in the periodical "Magnetic Resonance in Medicine", 20, pages 268 through 284 (1991) describes a method that is suitable for the quantitative determination of eddy currents of higher order. Similar to the methods according to German OS 43 25 031 and U.S. Pat. No. 4,910,460, eddy currents are graphically displayed by following a gradient pulse with an imaging sequence that generates a stimulated echo whose phase relation is proportional to the eddy currents. The time development of the eddy currents also can be identified by measuring at different time intervals following the gradient pulse. The disadvantage of this method is the long duration of the imaging sequence of approximately 5 seconds per Fourier line and the time interval following the gradient pulse, as a result of which a measuring time of at least ten minutes arises. Since the sequence must be repeated in a number of steps and for all three gradients, overall measuring times of far above an hour result. This is significantly too long for a method that is to be utilized in routine fashion for compensation.

SUMMARY OF THE INVENTION

An object of the present invention is to provide a method for acquiring eddy currents wherein at least the cross-terms of an eddy current can be identified in the selected slice within a short time.

This object is achieved in a method having the following, successive steps:

a) a spatially expansive phantom is introduced into the examination region of the nuclear magnetic resonance apparatus;

b) a measuring gradient pulse that exhibits a prescribable pulse width is activated;

c) after the deactivation of the measuring gradient pulse, at least two imaging sequence blocks following one another at the spacing ($t_1$, $t_2$, $t_n$) are generated, with an at least two-dimensional, complex data set being generated from their imaging signals, and with the phase information contained therein being proportional to the magnetic field strength.

This method, in addition to supplying two-dimensional location information, also supplies time information about the distribution of the eddy currents within a selected slice. At least the cross-terms of the eddy currents thus can be reliably identified in a simple and fast way.

The simplest possibility of acquiring eddy currents is in an embodiment of the method wherein:

c) at least two gradient echo blocks serve as imaging sequence blocks, these being generated after the measuring gradient pulse is shut off and following one another at the spacing ($t_1$, $t_2$, $t_n$) wherein, in each gradient echo block, c1) a first, slice-selective RF pulse is emitted under the influence of a slice-selection gradient pulse, and c2) the gradient echo generated as a result thereof and serving as the imaging signal is acquired during the decay time of the eddy current caused by the measuring gradient pulse, and c3) a phase-coding gradient precedes each gradient echo, and c4) the gradient echo is read out under a readout gradient in a direction perpendicular to the phase coding gradient, and d) the steps b) and c) are repeated respectively with incremented phase code gradients.

In this embodiment, thus, at least two gradient echo blocks are provided as imaging sequence blocks. This embodiment, in addition to supplying two-dimensional location information, also supplies time information about the distribution of the eddy currents within a selected slice, so that at least the cross-terms of the eddy currents can be dependably identified simply and rapidly.

In a further embodiment of the method, the above steps b) and c) are repeated with at least one other position of the selected slice. In another embodiment, the above steps b) through d) are repeated with at least one different position of the selected slice. As a result, three-dimensional location information is obtained in these two embodiments of the inventive method in addition to the time information about the course of the eddy currents. In addition to the cross-terms, the terms of a higher order can be additionally identified on the basis of the now-available spatial and time information about the eddy current distribution. Since these embodiments of the inventive method allow a significantly faster acquisition of eddy currents that are caused by switched magnetic field gradients and contain the cross-terms and terms of a higher order, they are particularly suited for employment as routine procedures.

When, given a measurement of at least two selected slices, an acquisition of eddy currents of an order higher than the first order is desired without lengthening the measuring time, a further embodiment of the method can be used, wherein the gradient echo blocks of the various slices are interleaved in one another.

In further embodiments two-dimensional images can be calculated from the acquired eddy currents, the non-linear eddy current components can be calculated, and these non-linear eddy current parts can be compensated.

DESCRIPTION OF THE DRAWINGS

FIG. 1 shows slice-selective RF pulses used in the inventive method.

FIG. 2 shows the curve of slice-selection gradient pulses used in the inventive method.

FIG. 3 shows the curve of the readout gradients used in the inventive method.

FIG. 4 shows the curve of the phase coding gradients used in the inventive method.

FIG. 5 shows the curve of the eddy current $I_E$ identified by the inventive method.

DESCRIPTION OF THE PREFERRED EMBODIMENTS

In the method described in FIGS. 1 through 5 for acquiring eddy currents that are caused by switched magnetic field gradients of a magnetic resonance apparatus and that contain cross-terms and terms of a higher order, a spatially expansive phantom, for example a spherical phantom having a diameter of 240 mm, is first introduced into the examination region of the magnetic resonance tomography apparatus. Subsequently, a measuring gradient pulse GM is activated for a longer time, for example for one through two seconds. The measuring gradient pulse GM exhibits a prescribable pulse width $t_G$. The pulse $t_G$ of the measuring gradient pulse GM is preferably longer than the eddy current time constant to be investigated.

After the measuring gradient pulse GM has been shut off, at least two gradient echo blocks GE1, GE2 through GEn are generated following one another at spacings $t_1$, $t_2$ through $t_n$. The spacing $t_n$ of the last gradient echo block GEn is preferably of a size so that all eddy currents $I_E$ of the measuring gradient GM have largely decayed (for example one through five seconds).

A first slice-selective RF pulse RF1, RF2 through RFn is emitted in each gradient echo block GE1, GE2 through GEn under the influence of a slice selection gradient pulse GS1, GS2 through GSn. Due to the influence of the slice selection gradient pulse GS1, GS2 through GSn according to FIG. 2, the excitation is limited to a slice of the phantom. Subsequently, the dephasing of the nuclear spins caused by the slice selection gradient GS1, GS2 through GSn is reversed by a rephasing gradient GS⁻ in the negative direction.

The gradient echo S1, S2 through Sn generated by the application of the first slice-selective RF pulse RF1, RF2 through RFn serves as an imaging signal and is acquired during the decay time of the eddy current $I_E$ caused by the measuring gradient pulse GM.

For phase-sensitive sampling of the gradient echos S1, S2 through Sn, a phase coding gradient GP1, GP2 through GPn precedes each gradient echo S1, S2 through Sn. A dephasing gradient GD is activated isochronically with the phase coding gradient GP1, GP2, GPn in the embodiment of the inventive method described in FIG. 1 through FIG. 5 in order to reverse the dephasing of the nuclear spins caused by the rephase gradient shown on the axis GR⁻. The radio-frequency excitation pulses are shown on axis RF, the slice selection gradient on axis GS, the rephase gradient on axis GR, and the phase encoding gradient on axis GP.

The gradient echo S1, S2 through Sn is read out under a readout gradient GR1, GR2 through GRn in a direction perpendicular to the phase coding gradient GP1, GP2 through GPn.

The sequence of measuring gradient pulse GM and of n gradient echo blocks GE1, GE2 through GEn is repeated with a repetition time $t_R$, with the phase code gradient GP1, GP2 through GPn incremented in each repetition.

A number of two-dimensional data sets i corresponding in number to the number n of gradient echo blocks GE1, GE2 through GEn is determined from the identified gradient echoes S1, S2 through Sn. These data sets i, following a two-dimensional Fourier transformation, supplying the corresponding number n of complex two-dimensional images of the phantom.

All complex data sets i are phase-corrected such at points in time $t_i$ with a reference data set such that phase images can be calculated therefrom that represent the time decay of the eddy currents $I_E$ at the points in time $t_i$. A data set in which the eddy currents have largely decayed is preferably selected as the reference data set.

The phase relation $\phi_i(x, y)$ for each pixel for each data set i having the coordinates (x, y) is established by the following equation:

$$\varphi_i(x, y) = \gamma \int_{t_i}^{t_i+T_E} B(x, y, t)dt + \varphi_0(x, y)$$

The phase $\phi_i(x, y)$ is thus proportional to the integral over the magnetic field B between the slice-selected radio frequency excitation pulse RF1, RF2 through RFn and the gradient echo S1, S2 through Sn plus a constant phase error $\phi_0(x, y)$, whereby the proportionality factor Y is the gyromagnetic constant.

The magnetic field B is composed of the time-constant field distribution $B_0$, the time-variable eddy current field $B_M$ that is generated by the measuring gradient GM, and of the eddy current field $B_S$ that is generated by the gradient echo block GE1, GE2 through GEn itself:

$$B(x, y, t)=B_0(x, y)+B_M(x, y, t)+B_S(x, y, t)$$

For the phase relation $\phi_i(x, y)$ of each and every pixel of the data set i having the coordinates (x, y), one then obtains:

$$\phi_i(x, y)=Y(B_0(x, y)+B_M(x, y, t_i))T_E+\phi_0+\phi_S(x, y)$$

For the time-constant field distribution $B_0$ and the time-variable eddy current field $B_M$, the integral was calculated given the assumption that the eddy current $I_E$ of the measuring gradient pulse GM is constant during the echo time $T_E$. The phase part $\phi_S$ that arises due to the eddy currents of the gradient echo block GE1, GE2 through GEn itself is the same for all gradient echo blocks. When the $n^{th}$ gradient echo GEn is then employed for phase correction of all others, then only the eddy current field $B_S$ of the measuring gradient pulse GM remain:

$$\phi_i(x, y)-\phi_n(x, y)=YB_M(x, y, t_i)T_E-YB_M(x, y, t_n)T_E \approx YB_M(x, y, t_i)T_E$$

When the time $t_n$ is long compared to the time constant of the eddy current $I_E$, then the phase difference $\Delta\phi_i$ is proportional to the eddy current $I_E$ at point in time $t_i$.

In order to then obtain eddy current images at the points in time $t_i$, each complex, two-dimensional image is phase-corrected with the data set at the point in time $t_n$. Phase images that represent the time decay of the eddy currents at the points in time $t_1$ through $t_{n-1}$ then can be calculated therefrom.

The non-linear parts of the occurring eddy currents $I_E$ can now be calculated from a development of the field distribution according to spherical functions. Since the phase images can contain phase discontinuities, a direct data fit at the phase data is generally not possible.

One type of evaluation is to calculate the phase discontinuities from the data set in a known way and then to fit a development according to spherical functions.

An alternative method is disclosed in German OS 195 11 791. In this method, the phase differences of neighboring pixels of a data set are calculated and the spatial derivations of the spherical functions are formed with a fit method.

Both methods supply the coefficients of the spherical functions at points in time $t_i$. As a result of a fit of time-decaying e-functions a $e^{-t/T}$ to the coefficients, an amplitude and a time constant are obtained for each coefficient.

When the non-linear eddy current parts have been calculated, then these can also be compensated. This preferably occurs by filtering the gradient pulses generated in a gradient channel, as a result of which the amplitudes and the time constants of these non-linear eddy currents are compensated. As a result of the filtering, a compensation pulse is available that is forwarded to the two other gradient channels and/or to shim coils of the magnetic resonance apparatus.

Cross-terms of the eddy current can be described by a spherical function of the first order. Thus, for example, the x-gradient generates an A10 eddy current that corresponds to a z-gradient. As described in the literature, such terms can be compensated by a counter-pulse of the corresponding gradient (in the example, this is the z-gradient).

The terms of a higher order in the eddy current can be compensated by pulses of the shim coils of the nuclear magnetic resonants apparatus. In practice, this can be limited to the terms of the second and third order since higher orders only cause small eddy current fields.

In a nuclear magnetic resonance apparatus having a superconducting magnet, the eddy currents in the cold shields dominate with time constants of 300 through 500 ms. i.e., the measuring gradient pulse GM should have a length of, for example, of 2 seconds, and the distance $t_n$ of the gradient echo block GEn from the measuring gradient pulse GM should lie at three seconds. A value of five seconds thus derives for the repetition time $T_R$. When only one time constant is to be identified, four through eight data sets i suffice. Since the phase image exhibits only slight variation, a matrix of 16×16 suffices, as a result of which a measuring time of 80 seconds is required.

The measurement of only one selected slice does not suffice in order to identify eddy currents up to the second order; rather, at least one further selected slice must be measured. The two selected slices exhibit, for example, a slice shift of ±50 mm.

In order to avoid lengthening the measuring time, the gradient echo blocks should be interleaved in one another. The interleaving of the gradient echo blocks is achieved in that, for example, the echo 1 of slice 1 is first measured, then the echo 1 of slice 2 then echo 2 of slice 1 then echo 2 of slice 2, etc.

Further variations are conceivable within the scope of the invention. Thus, for example, a three-dimensional measurement (time information and three-dimensional location information over the course of the eddy currents) can be achieved with an additional phase coding gradient in selection direction.

Further, it is also possible to implement the phase correction not with the last gradient Sn but with an additional measurement, whereby the measuring gradient GM has a different strength such as, for example, 0 or is inverted (negative measuring gradient pulse).

Further, the measuring gradient pulse GM need not necessarily be the slice selection gradient pulse GS. Within the scope of the invention, the measuring gradient GM can also have an arbitrary orientation.

The phase correction can, moreover, ensue with a gradient echo that lies preceding the measuring gradient pulse GM.

Further, by omitting the readout gradient GR, a FID (free induction decay) can be generated, the frequency or the phase can be interpreted (time information) and the (two-dimensional or three-dimensional) location information can be generated by an additional phase code gradient in readout direction (given a correspondingly longer measuring time).

As can be seen from the above explanations, the inventive principle can be versatilely fashioned. An acquisition of the eddy currents under discussion can thus be undertaken in a simple way with very little time outlay. In addition, further information about the eddy currents can be acquired with only a slightly greater time outlay.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring eddy currents that are caused by switched magnetic field gradients in a magnetic resonance imaging apparatus and that contain cross-terms, said method comprising the successive steps of:
   a) introducing a spatially expansive phantom into an examination region, having a magnetic field with a magnetic field strength, of the magnetic resonance apparatus;
   b) activating a measuring gradient pulse that exhibits a prescribable pulse width and thereby causing an eddy current which affects said magnetic field strength; and
   c) deactivating the measuring gradient pulse and thereafter generating at least two imaging sequence blocks following one another at spacings ($t_1$, $t_2$, $t_n$) and thereby obtaining imaging signals, and generating an at least two-dimensional, complex data set, containing phase information, from said imaging signals, the phase information being proportional to the magnetic field strength.

2. A method according to claim 1 wherein step (c) comprises:
   generating at least two gradient echo blocks as said imaging sequence blocks after deactivating the measuring gradient pulse and following one another at the spacing ($t_1$, $t_2$, $t_n$) and in each gradient echo block,
   emitting a first, slice-selective RF pulse under the influence of a slice-selection gradient pulse and thereby generating a gradient echo, using the gradient echo as said imaging signal and acquiring said gradient echo,
   preceding each gradient echo with a phase-coding gradient;
   reading out the gradient echo under a readout gradient in a direction perpendicular to the phase coding gradient; and further comprising
   d) repeating steps b) and c) respectively with an incremented phase coding gradient.

3. A method according to claim 1 comprising:
   repeating steps b) and c) with at least one other position of the selected slice for acquiring eddy currents that contain terms of a higher order.

4. A method according to claim 3 comprising:
   interleaving the respective gradient echos of a plurality of selected slices in one another.

5. A method according to claim 2 comprising:
   repeating steps b) through d) with at least one different position of the selected slice for acquiring eddy currents that contain terms of a higher order.

6. A method according to claim 5 comprising:
   interleaving the respective gradient echos of a plurality of selected slices in one another.

7. A method according to claim 2 comprising:
   activating an additional phase coding gradient is activated in addition to the slice selection gradient pulse.

8. A method according to claim 2 comprising:
   generating a plurality of two-dimensional data sets respectively from the gradient echos serving as said imaging signals, two-dimensionally Fourier transforming said data sets and thereby obtaining a plurality of complex, two-dimensional images of the phantom, corresponding to the plurality of gradient echos.

9. A method according to claim 8 comprising:
   phase-correcting all of said complex data sets with a reference data set at points in time ($t_i$) and calculating phase images therefrom that represent the time decay of the eddy currents at the points in time ($t_i$).

10. A method according to claim 9 that comprising:
    using a data set wherein the eddy currents have largely decayed as said reference data set.

11. A method according to claim 8 comprising:
    calculating non-linear components of the eddy currents from a development of a field distribution of the magnetic field according to spherical functions.

12. A method according to claim 8 comprising:
    generating said gradient pulses which cause eddy currents in a first gradient channel and generating other gradients in other gradients channels;
    compensating the non-linear components of the eddy currents by filtering the gradient pulses in said gradient channel that excite eddy currents and thereby producing a compensation pulse; and
    supplying said compensation pulse to the other gradient channels.

13. A method according to claim 8 comprising:
    providing shim coils respectively charged with shim currents in respective shim coil channels;
    generating said gradient pulses which cause eddy currents in a gradient channel;
    compensating the non-linear components of the eddy currents by filtering the gradient pulses in said gradient channel that excite eddy currents and thereby producing a compensation pulse; and
    supplying said compensation pulse to said shim coil channels.

14. A method according to claim 1 wherein step (c) comprises:
    generating at least two gradient echo blocks as said imaging sequence blocks after deactivating the measuring gradient pulse and following one another at the spacing ($t_1$, $t_2$, $t_n$) and in each gradient echo block, emitting a first, RF pulse and a phase-coding gradient pulse in selection direction and thereby generating a gradient echo, using the gradient echo as said imaging signal and acquiring said gradient echo, preceding each gradient echo with a phase-coding gradient, reading out the gradient echo under a readout gradient in a direction perpendicular to the phase coding gradient; and further comprising d) repeating steps b) and c) respectively with an incremented phase coding gradient.

15. A method according to claim 1 wherein step (c) comprises:

generating at least first, second and third gradient echo blocks as the respective first, second and third imaging sequence blocks after deactivating the measuring gradient pulse and following one another at the spacing ($t_1$, $t_2$, $t_n$) and in each gradient echo block, emitting a first, RF pulse and a phase-coding gradient pulse in selection direction and thereby generating a gradient echo, using the gradient echo as said imaging signal and acquiring said gradient echo, preceding each gradient echo with a phase-coding gradient in a phase-coding direction and a further phase-coding gradient in a selection direction perpendicular to said phase-coding direction, reading out the gradient echo under a readout gradient in a direction perpendicular to the phase coding direction and to said selection direction; and further comprising d) repeating steps b) and c) respectively with an incremented further phase coding gradient.

* * * * *